US012757334B2

(12) United States Patent
Wang et al.

(10) Patent No.: US 12,757,334 B2
(45) Date of Patent: Oct. 6, 2026

(54) CIRCUIT BOARD STRUCTURE AND MANUFACTURING METHOD THEREOF

(71) Applicant: UNIMICRON TECHNOLOGY CORP., Taoyuan City (TW)

(72) Inventors: Chin-Sheng Wang, Taoyuan City (TW); Chen-Hao Lin, Taoyuan City (TW); Ansheng Lee, Taoyuan City (TW); Kai-Ming Yang, Taoyuan City (TW); Pu-Ju Lin, Taoyuan City (TW); Cheng-Ta Ko, Taoyuan City (TW)

(73) Assignee: UNIMICRON TECHNOLOGY CORP., Taoyuan City (TW)

( * ) Notice: Subject to any disclaimer, the term of this patent is extended or adjusted under 35 U.S.C. 154(b) by 255 days.

(21) Appl. No.: 18/669,313

(22) Filed: May 20, 2024

(65) Prior Publication Data

US 2025/0331108 A1 Oct. 23, 2025

(30) Foreign Application Priority Data

Apr. 17, 2024 (TW) ................................ 113114287

(51) Int. Cl.
*H05K 1/11* (2006.01)
*H05K 3/40* (2006.01)

(52) U.S. Cl.
CPC .......... *H05K 3/4007* (2013.01); *H05K 1/111* (2013.01); *H05K 2201/099* (2013.01)

(58) Field of Classification Search
CPC . H05K 3/4007; H05K 1/111; H05K 2201/099
See application file for complete search history.

(56) References Cited

U.S. PATENT DOCUMENTS

| | | | | |
|---|---|---|---|---|
| 8,227,711 B2 | 7/2012 | Hsu | | |
| 10,602,621 B1 | 3/2020 | Hu | | |
| 2019/0103288 A1* | 4/2019 | Cho | .................... | H10W 70/093 |
| 2021/0120677 A1* | 4/2021 | Hwang | .................. | H05K 3/108 |
| 2025/0016921 A1* | 1/2025 | Jeong | ..................... | H05K 1/113 |

FOREIGN PATENT DOCUMENTS

| | | |
|---|---|---|
| TW | I393233 B | 4/2013 |
| TW | I693872 B | 5/2020 |

* cited by examiner

*Primary Examiner* — Jeremy C Norris
(74) *Attorney, Agent, or Firm* — Maschoff Brennan

(57) ABSTRACT

A circuit board structure and a manufacturing method thereof. The method includes: providing a temporary substrate; forming a dielectric layer having at least one through hole on the temporary substrate; forming a surface treatment layer on the temporary substrate in the at least one through hole; forming at least one pad on the surface treatment layer; forming a built-up structure on the dielectric layer; assembling the built-up structure to a substrate; removing the temporary substrate; and removing the dielectric layer.

12 Claims, 17 Drawing Sheets

CIRCUIT BOARD STRUCTURE AND MANUFACTURING METHOD THEREOF

CROSS-REFERENCE TO RELATED APPLICATIONS

This non-provisional application claims priority under 35 U.S.C. § 119 (a) on Patent Application No(s). 113114287 filed in Taiwan, R.O.C. on Apr. 17, 2024, the entire contents of which are hereby incorporated by reference.

TECHNICAL FIELD

The disclosure relates to a circuit board structure and a manufacturing method thereof, more particularly to a circuit board structure including at least one surface treatment layer and a manufacturing method thereof.

BACKGROUND

In order to facilitate the bonding (e.g., soldering or welding) between a pad of a circuit board structure and another electrical connection structure, a surface treatment layer is usually disposed on the pad. Also, during the manufacturing of the circuit board structure, the surface treatment layer is generally formed on the pad after the formation of the pad.

However, before the surface treatment layer is formed on the pad, the circuit board structure where the pad has been formed may have defects, such as warpage, that are disadvantageous to the formation of the surface treatment layer. Thus, the thickness and uniformity of the surface treatment layer formed on the pad can hardly be accurately controlled. In this way, the gap between the pads is not allowed to be shortened, and thus the density of the pads in the circuit board structure is not allowed to be increased, either.

SUMMARY

The disclosure provides a circuit board structure and a manufacturing method thereof, which accurately control the thickness and uniformity of a surface treatment layer to allow the gap between pads to be shortened, thereby increasing the density of the pads in the circuit board structure.

One embodiment of this disclosure provides a manufacturing method of circuit board structure including: providing a temporary substrate; forming a dielectric layer having at least one through hole on the temporary substrate; forming a surface treatment layer on the temporary substrate in the at least one through hole; forming at least one pad on the surface treatment layer; forming a built-up structure on the dielectric layer; assembling the built-up structure to a substrate; removing the temporary substrate; and removing the dielectric layer.

In one embodiment of the disclosure, the temporary substrate includes a base, a release layer and a seed layer. The release layer is disposed on the base. The seed layer is disposed on the release layer. The surface treatment layer is formed on the seed layer. The base is a ceramic substrate, a glass substrate, a silicon substrate or a stainless substrate.

In one embodiment of the disclosure, the manufacturing method of circuit board structure further comprises: forming a seed layer on the surface treatment layer after forming the surface treatment layer; and removing a part of the seed layer after removing the dielectric layer.

Another embodiment of this disclosure provides a manufacturing method of circuit board structure including: providing a temporary substrate; forming a dielectric layer having at least one through hole on the temporary substrate; forming a surface treatment layer on the temporary substrate in the at least one through hole; and forming at least one pad on the surface treatment layer.

Still another embodiment of this disclosure provides a circuit board structure including a built-up structure, at least one pad and a surface treatment layer. The at least one pad is disposed on the built-up structure. The surface treatment layer is disposed on the at least one pad. The surface treatment layer and the at least one pad are not overlapped with each other in a horizontal direction. The horizontal direction is perpendicular to a stacking direction of the surface treatment layer and the at least one pad.

In one embodiment of the disclosure, the surface treatment layer includes a first metal layer and a second metal layer. The second metal layer is disposed on the at least one pad. The first metal layer is disposed on the second metal layer.

In one embodiment of the disclosure, a material of the first metal layer is different from a material of the second metal layer.

In one embodiment of the disclosure, a material of the first metal layer is identical to a material of the second metal layer.

In one embodiment of the disclosure, the surface treatment layer further includes a third metal layer disposed between the second metal layer and the at least one pad.

In one embodiment of the disclosure, a material of the first metal layer is different from a material of the second metal layer, and the material of the first metal layer is identical to a material of the third metal layer.

In one embodiment of the disclosure, the surface treatment layer further includes a fourth metal layer disposed between the first metal layer and the second metal layer.

In one embodiment of the disclosure, a material of the first metal layer is different from a material of the second metal layer. The material of the first metal layer is identical to a material of the third metal layer. A material of the fourth metal layer is different from the material of the first metal layer and the material of the second metal layer.

In one embodiment of the disclosure, the at least one pad includes a buried part and a protruding part. The buried part is buried in the built-up structure. The protruding part protrudes from the buried part. At least a part of the protruding part is located outside the built-up structure.

In one embodiment of the disclosure, an outer surface of the buried part is flush with an outer surface of the built-up structure.

According to the circuit board structure and the manufacturing method thereof disclosed by above embodiments, before the formation of the pad, the surface treatment layer has been formed on the temporary substrate that is flat and has stable thermal expansion coefficient. In other words, before the formation of the pad, the surface treatment layer is previously formed on the temporary substrate without defects such as warpage. Thus, the thickness and the uniformity of the surface treatment layer are accurately controlled to allow the gap between the pads to be shortened, thereby increasing the density of the pads in the circuit board structure. Also, the flatness of the surface treatment layer is enhanced, and the roughness of the surface treatment layer is reduced.

In addition, the surface treatment layer is formed on the temporary substrate in the through hole. Thus, when the pad is formed on the surface treatment layer, the surface treatment layer and the pad are not overlapped with each other along the horizontal direction. That is, the surface treatment layer and the pad do not cover each other. With such configuration, the gas generated during the formation of the surface treatment layer will flow out of the through hole, and thus the cavity defect caused by the accumulation of the bubble is prevented, which further enhances the bonding force and reliability of the pad.

BRIEF DESCRIPTION OF THE DRAWINGS

The present disclosure will become better understood from the detailed description given herein below and the accompanying drawings which are given by way of illustration only and thus are not intending to limit the present disclosure and wherein.

DETAILED DESCRIPTION

Figure 1:
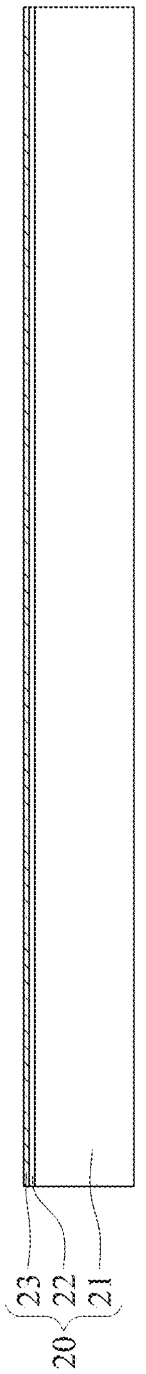
FIGS. 1 to 18 show a manufacturing method of a circuit board structure according to a first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Please refer to FIGS. 1 to 18. FIGS. 1 to 18 show a manufacturing method of a circuit board structure 10 according to a first embodiment of the disclosure. In this embodiment, the manufacturing method of the circuit board structure 10 may include following steps.

First, please refer to FIG. 1. A temporary substrate 20 is provided. The temporary substrate 20 includes, for example, a base 21, a release layer 22 and a seed layer 23. The release layer 22 is disposed on the base 21. The seed layer 23 is disposed on the release layer 22. The seed layer 23 is formed on the release layer 22 via, for example, sputtering. In this embodiment, the base 21 is, for example, a glass substrate, but the disclosure is not limited thereto. In other embodiments, the base may be a substrate, such as a ceramic substrate, a silicon substrate or a stainless substrate, that is flat and has stable thermal expansion coefficient.

Figure 2:
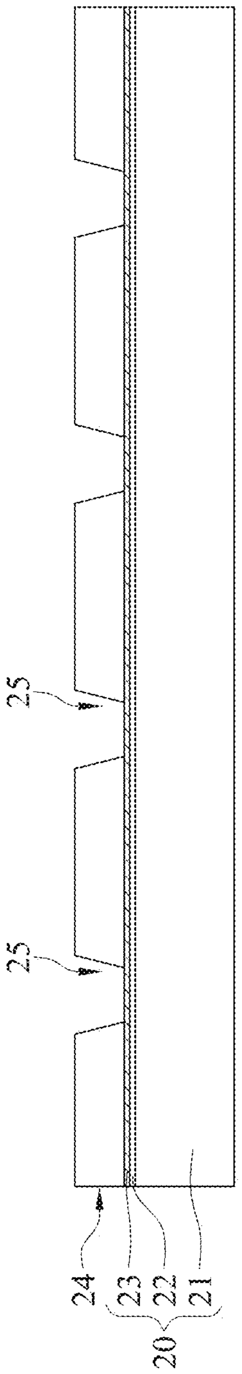

Next, please refer to FIG. 2, a dielectric layer 24 having a plurality of through holes 25 is formed on the seed layer 23.

Figure 3:
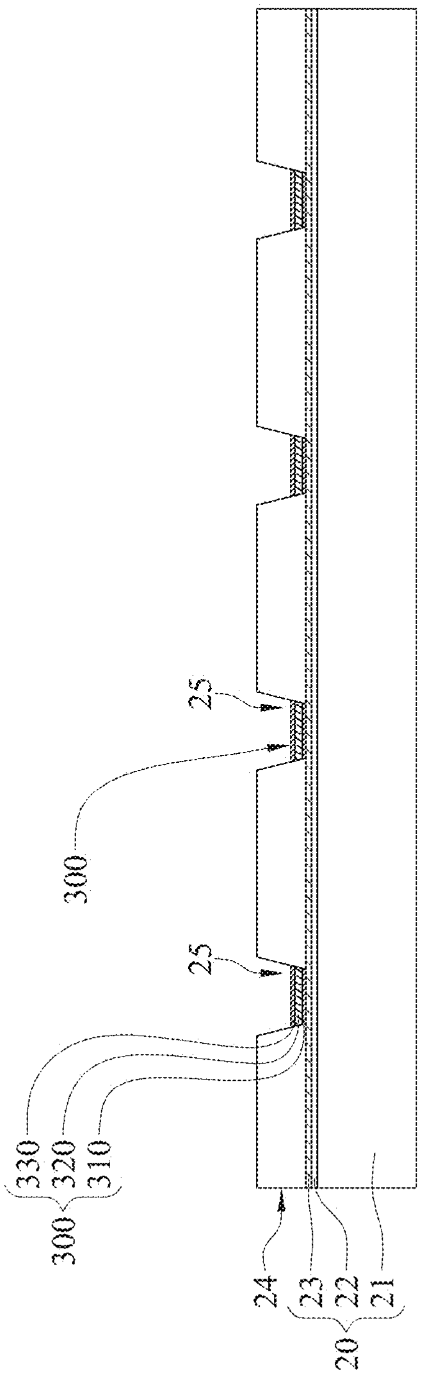

Next, please refer to FIG. 3. A plurality of surface treatment layers 300 is formed on the seed layer 23 in the through holes 25. The surface treatment layers 300 are formed on the seed layer 23 via, for example, electroplating. In this embodiment, each surface treatment layer 300 includes a first metal layer 310, a second metal layer 320 and a third metal layer 330. In FIG. 3, the first metal layer 310 is disposed on the seed layer 23, the second metal layer 320 is disposed on the first metal layer 310, and the third metal layer 330 is disposed on the second metal layer 320. In addition, in this embodiment, a material of the first metal layer 310 is different from a material of the second metal layer 320, and the material of the first metal layer 310 is identical to or the same as a material of the third metal layer 330. Further, in this embodiment, the first metal layer 310 and the third metal layer 330 are made by gold (Au), and the second metal layer 320 is made by nickel (Ni). The third metal layer 330 made by Au prevents the oxidation of the second metal layer 320 made by Ni.

Figure 4:
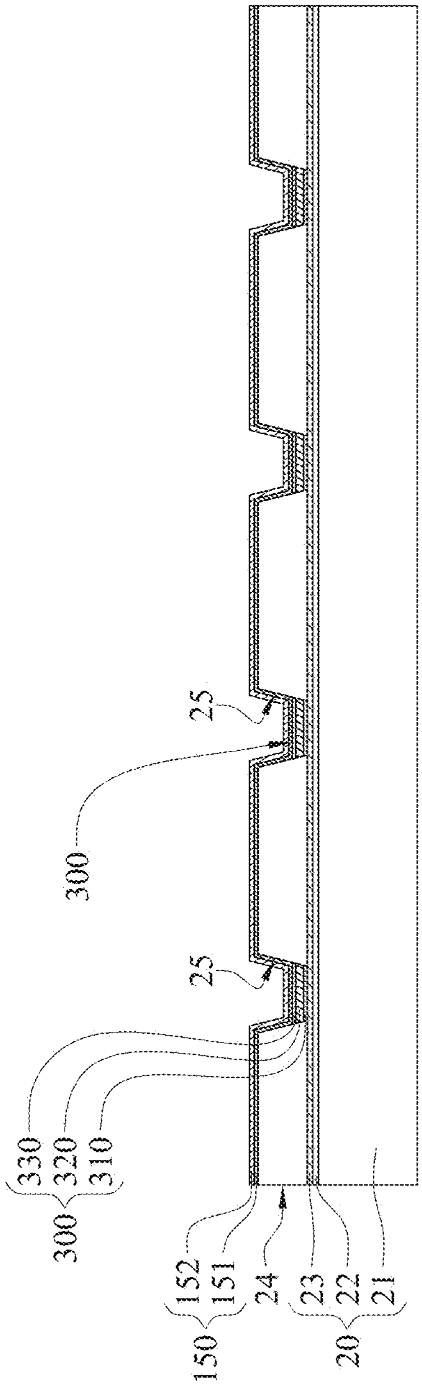

Next, please refer to FIG. 4, a seed layer 150 is formed on the dielectric layer 24 and the third metal layer 330. The seed layer 150 includes, for example, two metal layers 151 and 152. The metal layer 151 is made by, for example, titanium (Ti). The metal layer 152 is in made by, for example, copper (Cu). The metal layer 151 is disposed on the dielectric layer 24 and the third metal layer 330. The metal layer 152 is disposed on the metal layer 151.

Figure 5:
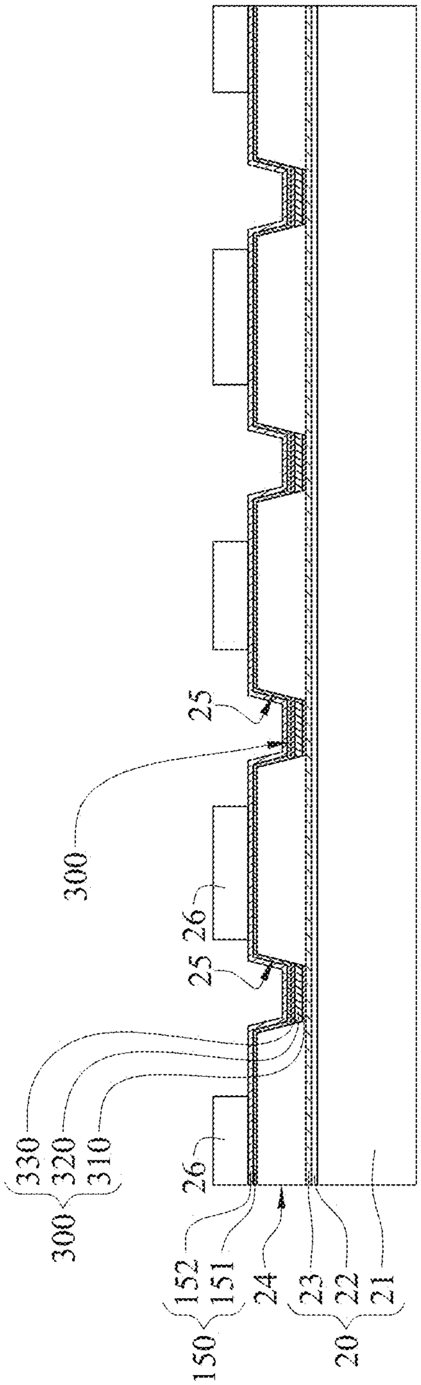
Figure 6:
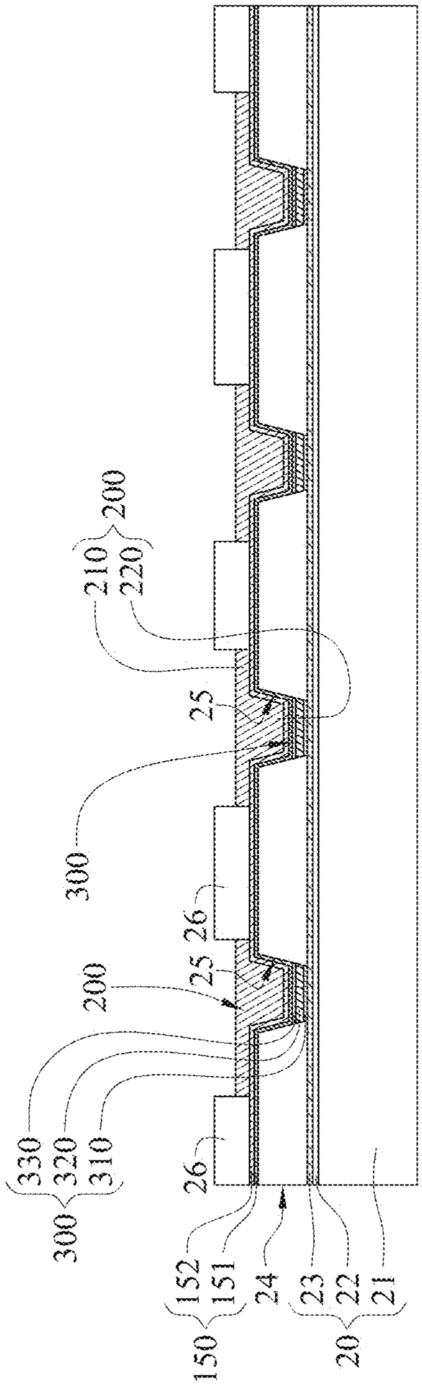

Next, please refer to FIG. 5. A plurality of photoresists 26 is formed on the metal layer 152. Next, please refer to FIG. 6. A plurality of pads 200 is formed on the metal layer 152 via, for example, electroplating. Next, please refer to FIGS. 6 and 7. The photoresists 26 are removed. Each pad 200 includes a buried part 210 and a protruding part 220 protruding from the buried part 210.

In this embodiment, before the formation of the pad 200, the surface treatment layer 300 has been formed on the temporary substrate 20 that is flat and has stable thermal expansion coefficient. In other words, before the formation of the pad 200, the surface treatment layer 300 is previously formed on the temporary substrate 20 without defects such as warpage. Thus, the thickness and the uniformity of the surface treatment layer 300 are accurately controlled to allow the gap between the pads 200 to be shortened, thereby increasing the density of the pads 200. Also, the flatness of the surface treatment layer 300 is enhanced, and the roughness of the surface treatment layer 300 is reduced.

Figure 7:
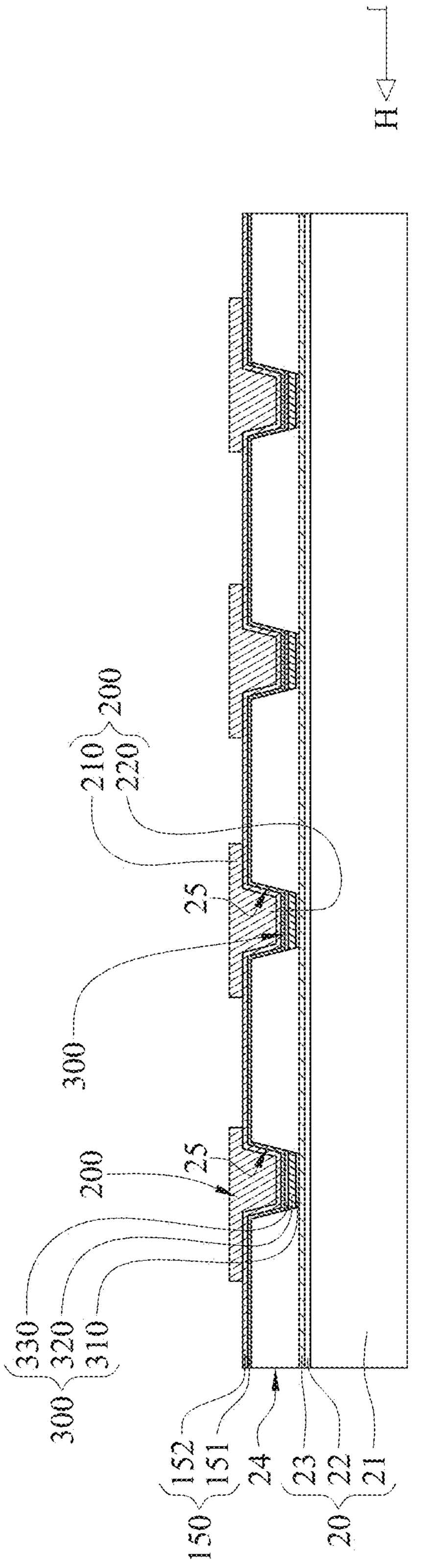

In addition, the surface treatment layer 300 is formed on the temporary substrate 20 in the through hole 25. Thus, as shown in FIG. 7, when the pad 200 is formed on the surface treatment layer 300, the surface treatment layer 300 and the pad 200 are not overlapped with each other along a horizontal direction H, where the horizontal direction H is perpendicular to a stacking direction S of the surface treatment layer 300 and the pad 200. That is, an entire of the surface treatment layer 300 is disposed above the pad 200. In other words, the surface treatment layer 300 and the pad 200 do not cover each other. With such configuration, the gas generated during the formation of the surface treatment layer 300 will flow out of the through hole 25, and thus the cavity defect caused by the accumulation of the bubble is prevented, which further enhances the bonding force and reliability of the pad 200.

Note that in other embodiments, the dielectric layer may have one through hole and there may be one pad.

Figure 8:
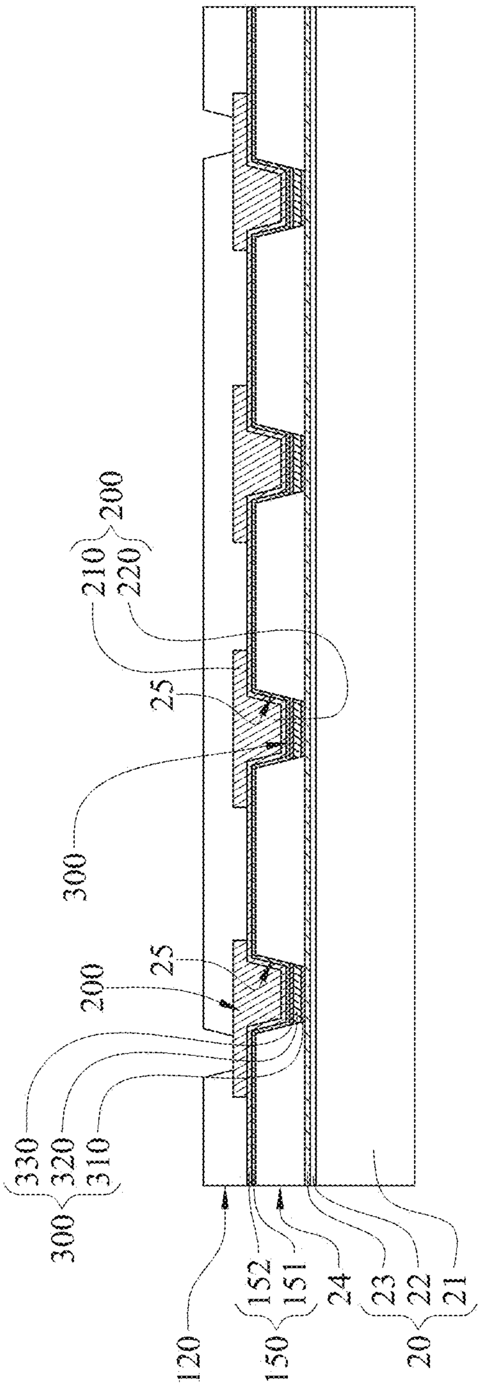

Next, please refer to FIG. 8. A dielectric layer 120 is formed on the metal layer 152 and the buried parts 210 of the pads 200. Further, the buried parts 210 are buried in the dielectric layer 120, and at least a part of each protruding part 220 is located outside the dielectric layer 120.

Figure 9:
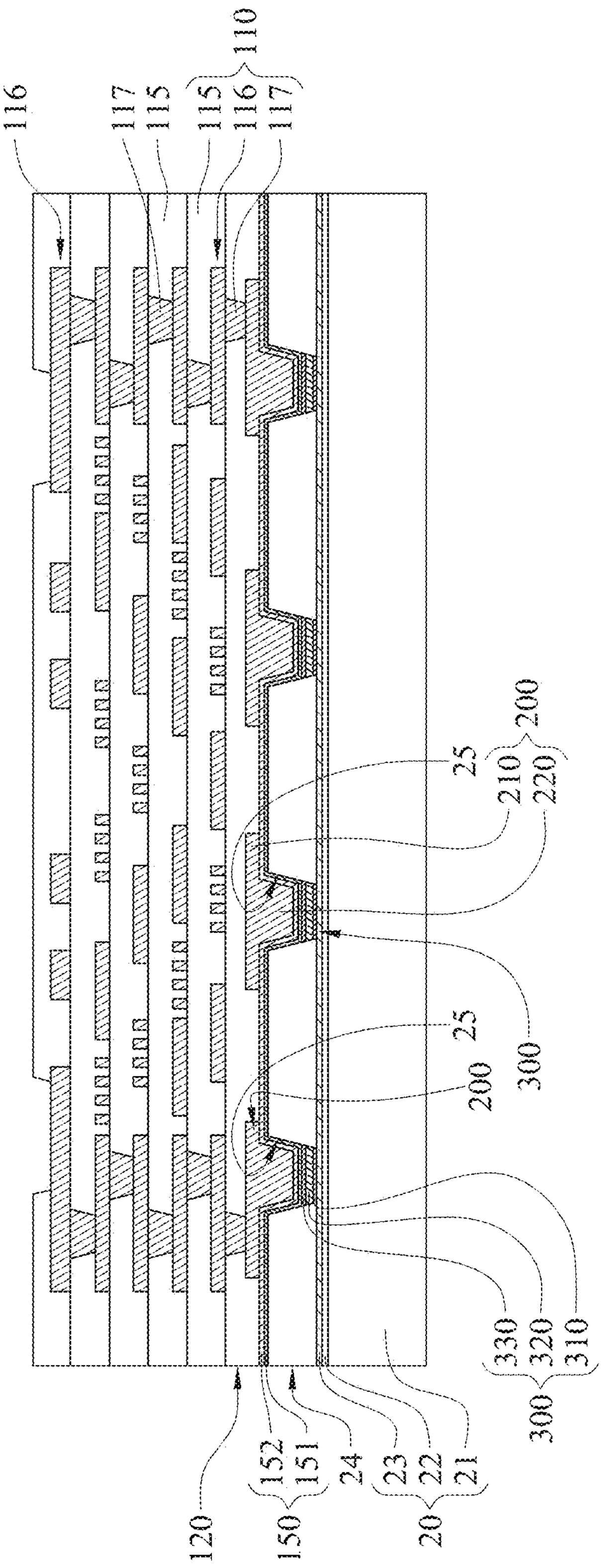

Next, please refer to FIG. 9. A built-up structure 110 is formed on the dielectric layer 120. The built-up structure 110 and the dielectric layer 120 may together be referred as another built-up structure. In detail, in this embodiment, the built-up structure 110 includes a plurality of dielectric layers 115, a plurality of circuit layers 116 and a plurality of conductive blind vias 117. The dielectric layers 115 are disposed on the dielectric layer 120. The circuit layers 116 are disposed on the dielectric layers 115 and 120, respectively. A part of the conductive blind vias 117 is/are disposed in the dielectric layer 120 and electrically connect(s) the buried part 210 and the circuit layer 116 located closest to the buried part 210. The remaining conductive blind via(s) 117 is/are disposed in the dielectric layers 115 and electrically connect(s) adjacent two circuit layers 116.

Figure 10:
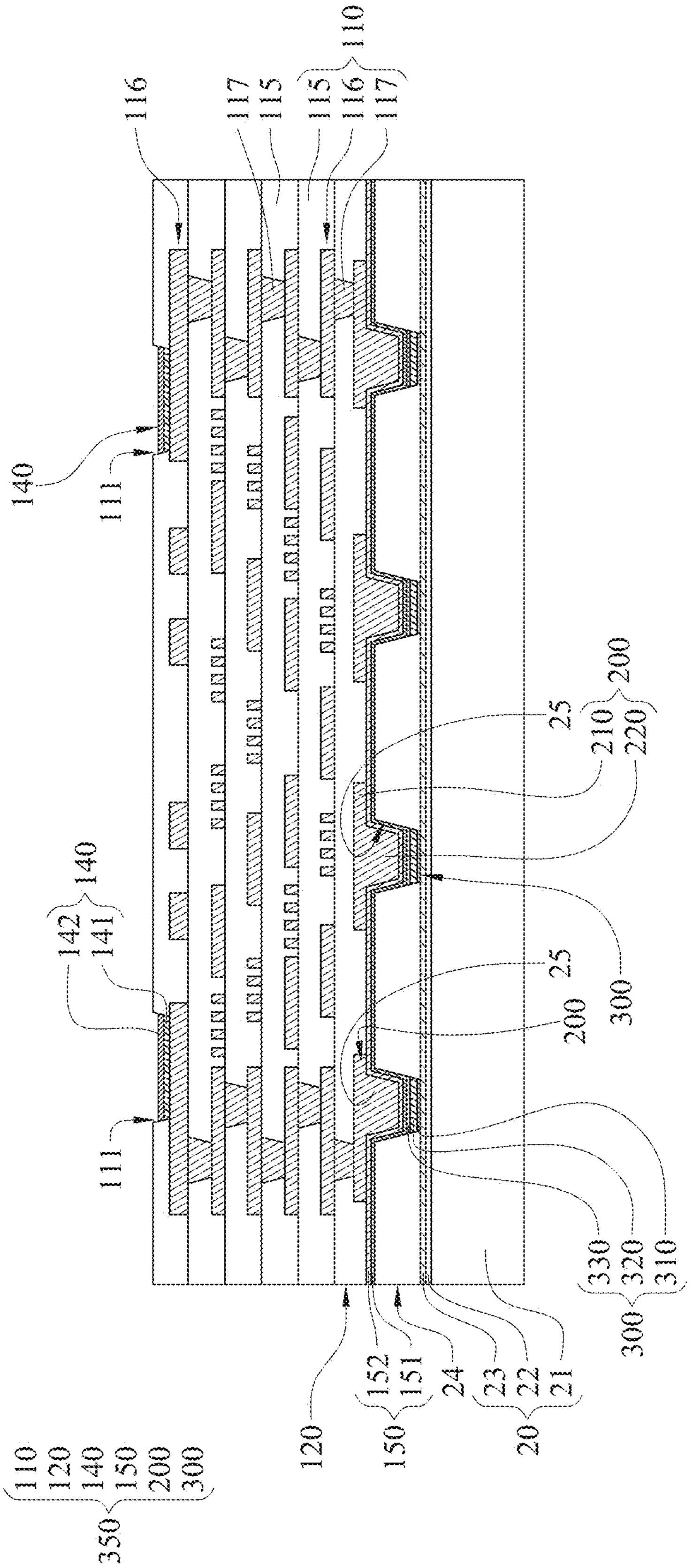

Next, please refer to FIG. 10. A plurality of surface treatment layers 140 is formed on the built-up structure 110. In detail, in this embodiment, each surface treatment layer 140 is located in an opening 111 of the built-up structure 110 (i.e., the opening 111 of the dielectric layer 115 located farthest away from the pads 200), and includes two metal layers 141 and 142. The metal layer 141 is disposed on the built-up structure 110, and is made by, for example, Ni. The metal layer 142 is disposed on the metal layer 141, and is made by, for example, Au. The built-up structure 110, the dielectric layer 120, the surface treatment layers 140, the seed layer 150, the pads 200 and the surface treatment layers 300 may together form a redistribution layer (RDL) substrate 350.

Figure 11:
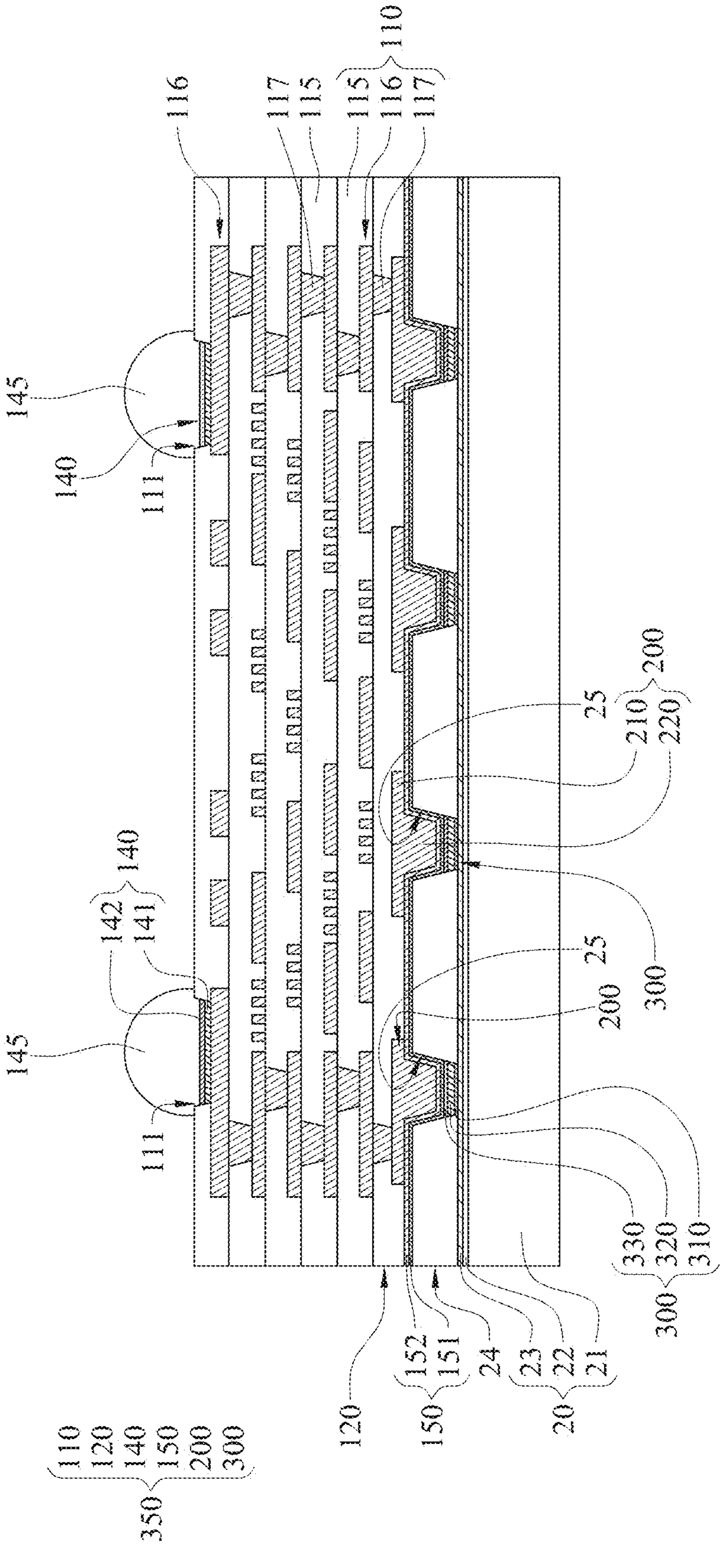
Figure 12:
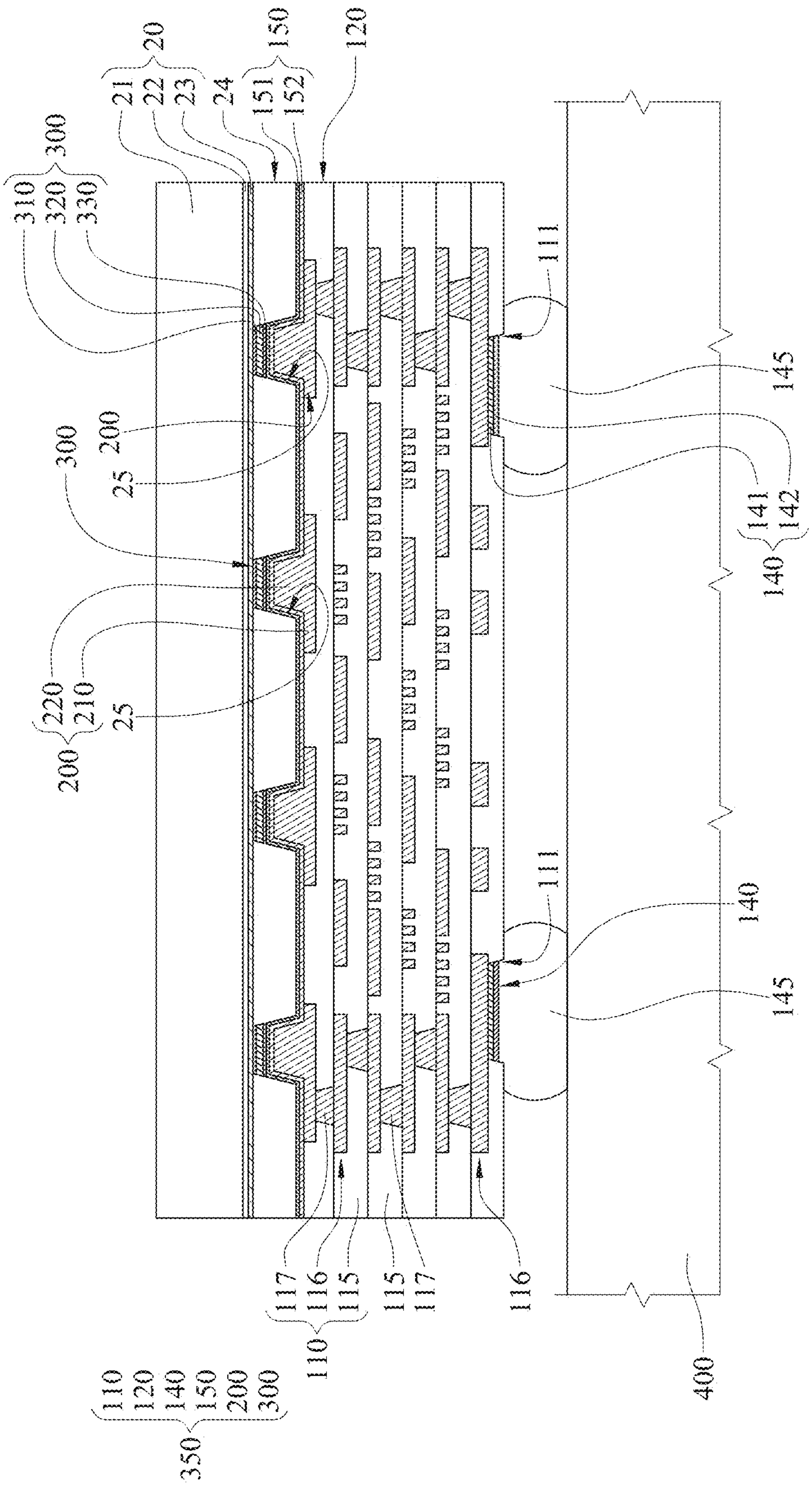

Next, please refer to FIG. 11. A plurality of solder balls 145 is formed on the surface treatment layers 140. Next, please refer to FIG. 12. The surface treatment layers 140 are electrically connected to a substrate 400 via the solder balls 145, thereby assembling the RDL substrate 350 to the substrate 400. The substrate 400 is, for example, a Ball Grid Array (BGA) substrate.

Figure 13:
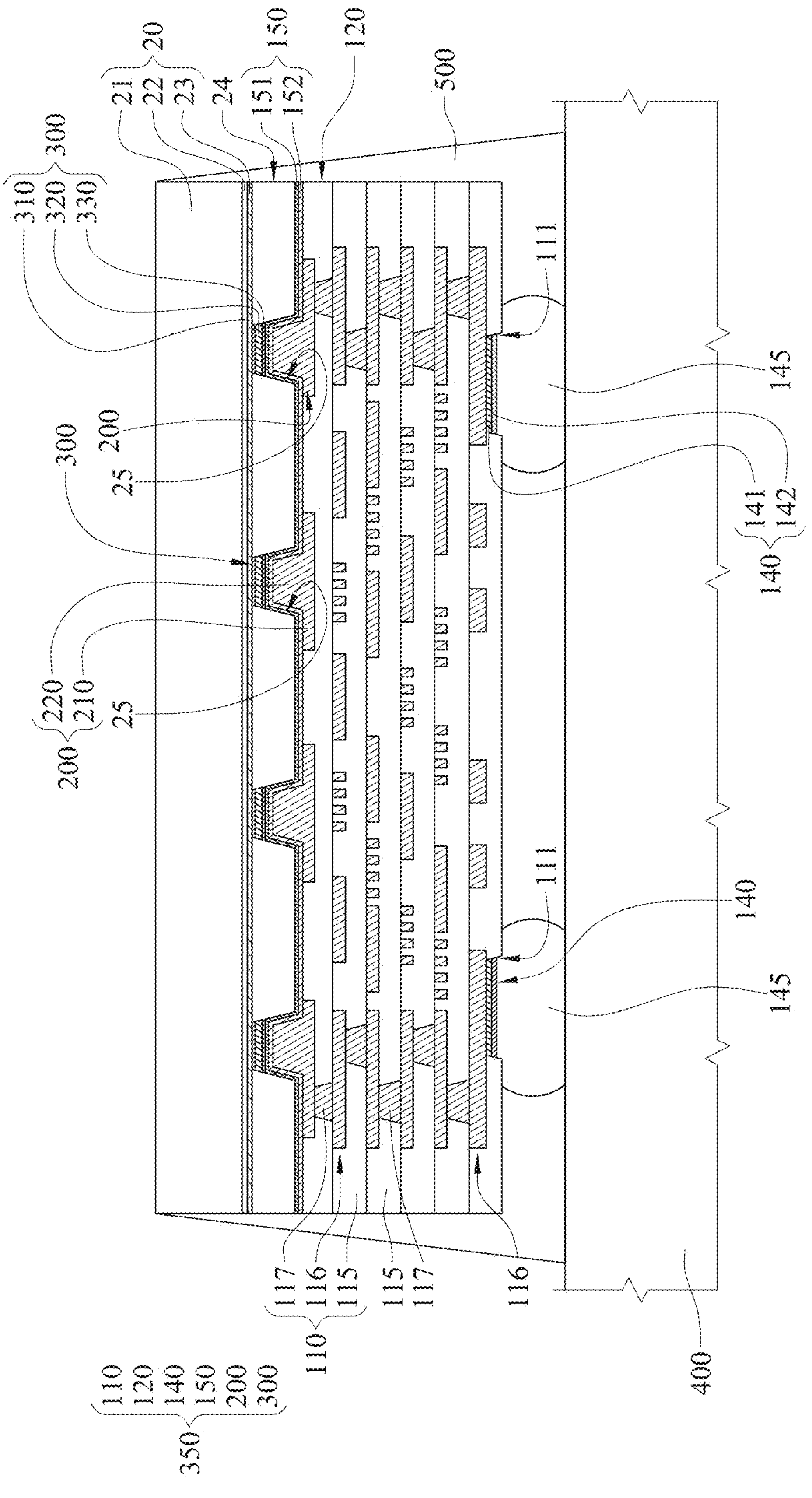
Figure 14:
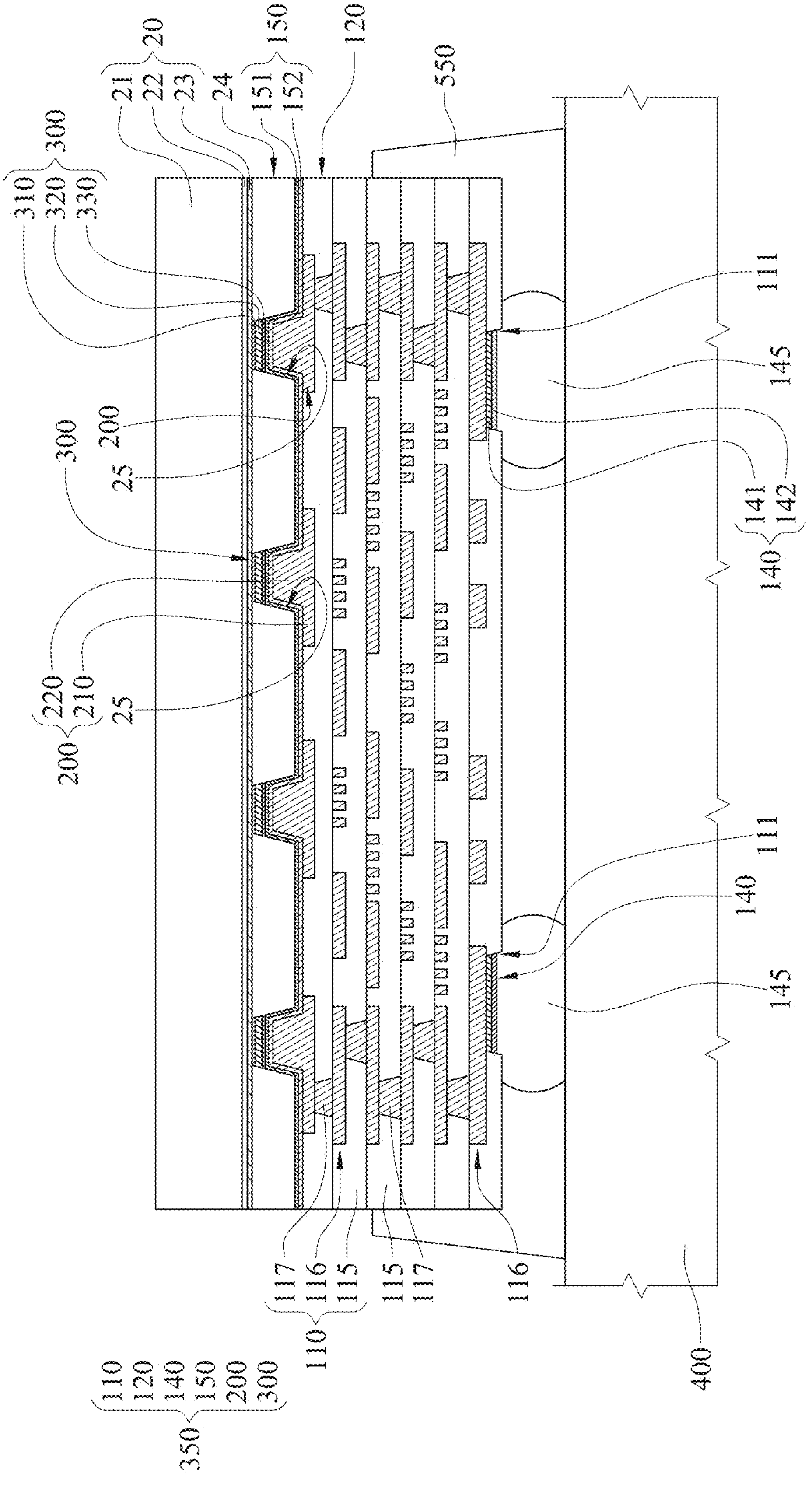

Next, please refer to FIG. 13. A molding material 500 is formed between the substrate 400 and the RDL substrate 350 via, for example, dispensing. Next, please refer to FIG. 14. A part of the molding material 500 is removed to form a mounding compound 550.

Figure 15:
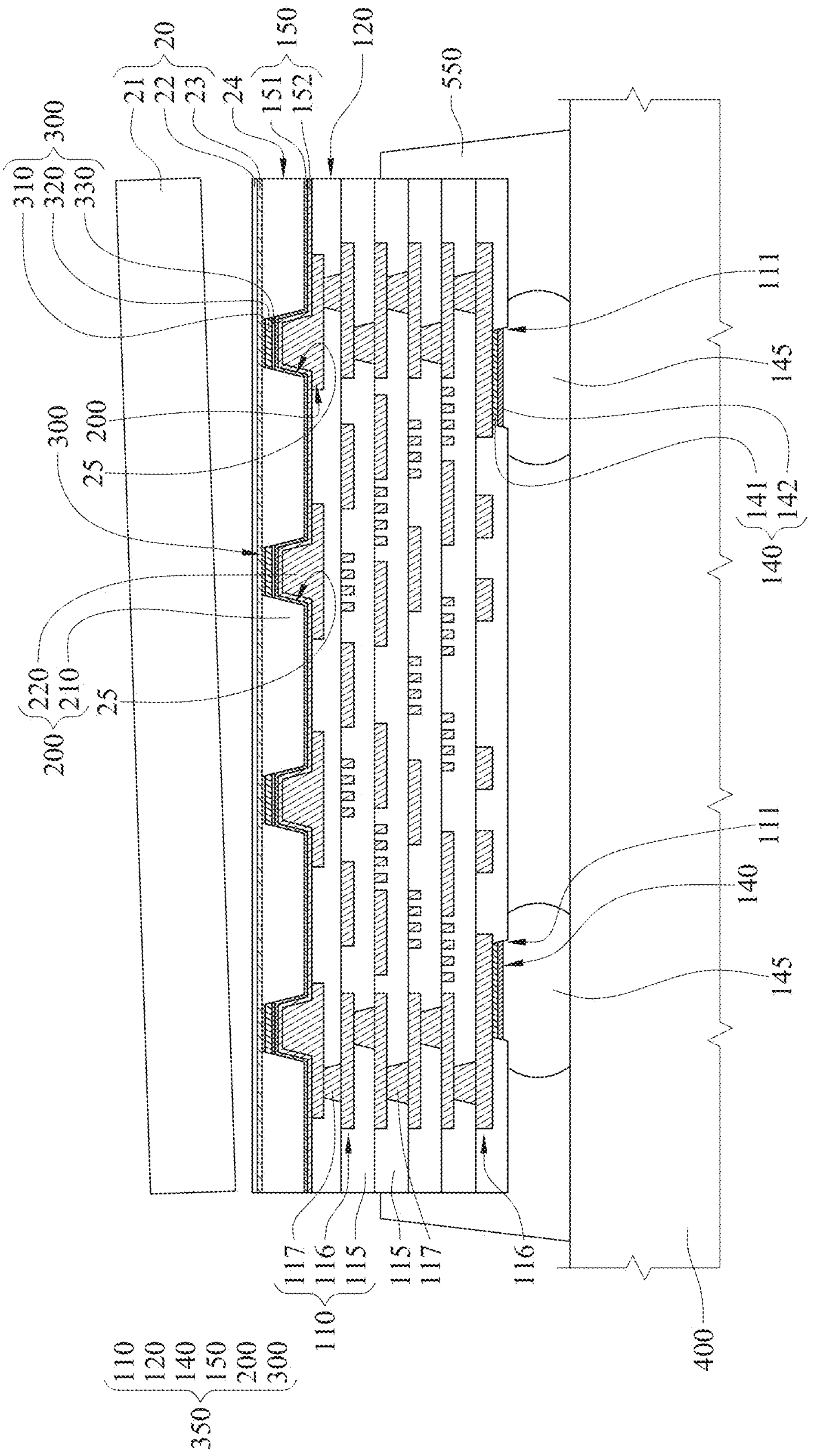
Figure 16:
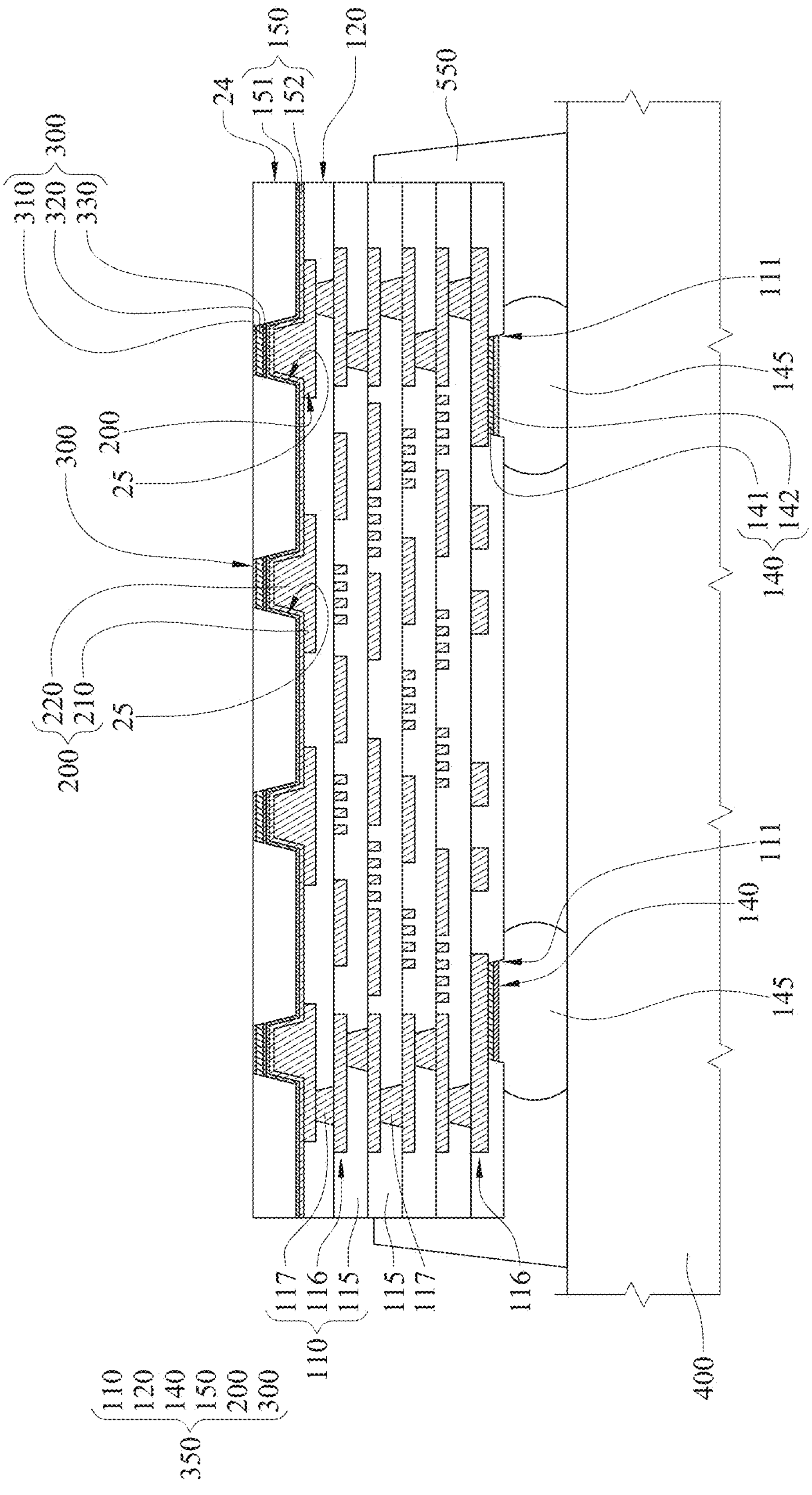

Next, please refer to FIG. 15. The base 21 is removed. Next, please refer to FIGS. 15 and 16. The release layer 22 is removed, a surface of the seed layer 23 is cleaned by plasma, and then the seed layer 23 is removed by, for example, etching.

Figure 17:
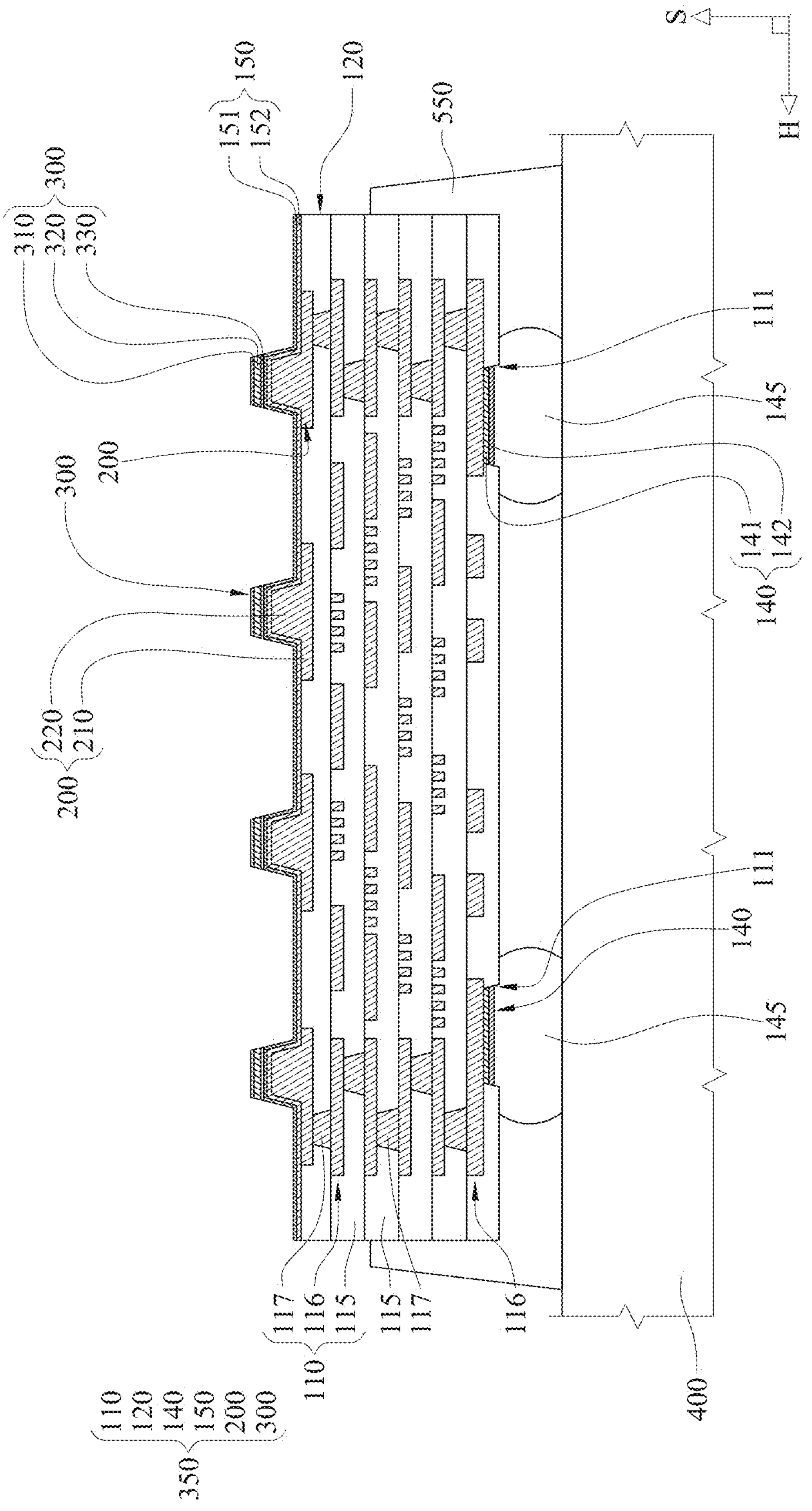

Next, please refer to FIG. 17. The dielectric layer 24 is removed by, for example, etching.

Figure 18:
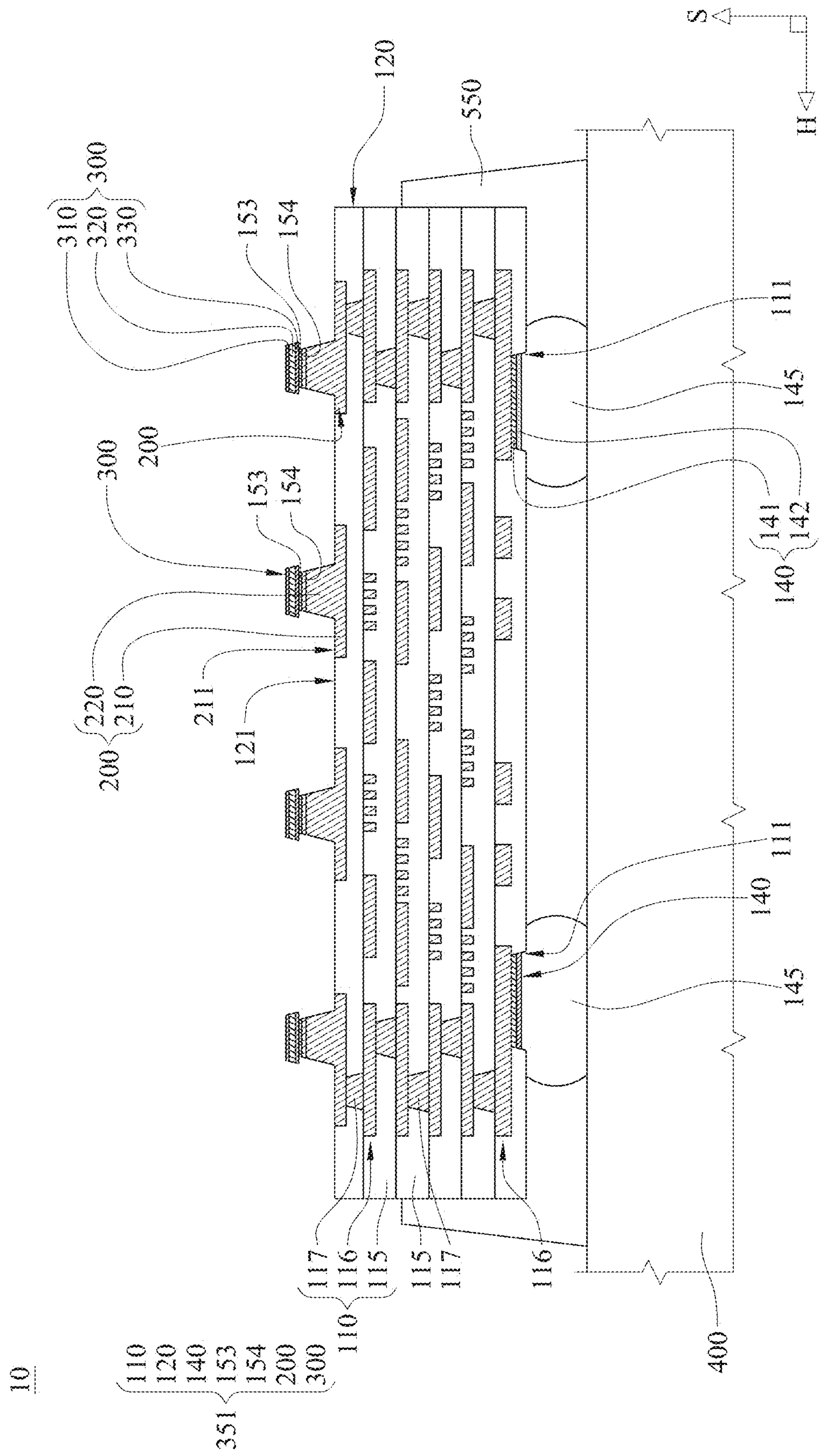

Next, please refer to FIG. 18. The two metal layers 151 and 152 of the seed layer 150 are partially removed by, for example, etching, thereby forming metal layers 153 and 154. Manufacturing of the circuit board structure 10 is completed so far. Note that in the drawing of this disclosure, in order to clearly show the detailed structure of the circuit board structure 10, the thickness of the metal layers 151-154 are exaggerated. Thus, in the drawings of this disclosure, a concave outline is formed between the metal layers 153 and 154 and the surface treatment layers 300. However, in practical, the metal layers 153 and 154 are thin enough to allow the outline between the metal layers 153 and 154 and the surface treatment layers 300 to be approximately flat.

In this embodiment, the circuit board structure 10 includes a RDL substrate 351 and the substrate 400 electrically connected to each other via the solder balls 145. The RDL substrate 351 includes the built-up structure 110, the dielectric layer 120, the surface treatment layers 140, the metal layers 153 and 154, the pads 200 and the surface treatment layers 300. The built-up structure 110 includes the dielectric layers 115, the circuit layers 116 and the conductive blind vias 117. The circuit layers 116 are disposed on the dielectric layers 120, respectively. A part of the conductive blind vias 117 is/are disposed in the dielectric layer 120, and electrically connect(s) the buried part 210 and the circuit layer 116 located closest to the buried part 210. The remaining conductive blind via(s) 117 is/are disposed in the dielectric layer 115, and electrically connect(s) two adjacent circuit layers 116. The dielectric layer 120 is disposed on the dielectric layers 115. The surface treatment layers 140 are disposed below the circuit layer 116 located farthest away from the pads 200, and the built-up structure 110 is located between the surface treatment layers 140 and the dielectric layer 120. Each pad 200 includes the buried part 210 and the protruding part 220 protruding from the buried part 210. The buried part 210 is buried in the dielectric layer 120. At least a part of the protruding part 220 is located outside the dielectric layer 120. The metal layers 153 and 154 are disposed on the protruding parts 220 of the pads 200.

In addition, in this embodiment, an outer surface 211 of each buried part 210 is flush with an outer surface 121 of the dielectric layer 120. That is, the protruding part 220 is entirely located outside the dielectric layer 120. However, the disclosure is not limited thereto. In other embodiments, the outer surface of each buried part may be located inside the outer surface of the dielectric layer. In other words, in other embodiments, a part of each protruding part may be located outside the dielectric layer, and the remaining part of each protruding part may be located inside the dielectric layer.

The surface treatment layer 300 is disposed on the pad 200. In detail, the surface treatment layer 300 includes the first metal layer 310, the second metal layer 320 and the third metal layer 330. The third metal layer 330 is disposed on the metal layer 153. The second metal layer 320 is disposed on the third metal layer 330. The first metal layer 310 is disposed on the second metal layer 320. That is, the third metal layer 330 is disposed between the pad 200 and the second metal layer 320, and the second metal layer 320 is disposed between the first metal layer 310 and the third metal layer 330.

Moreover, a thickness of the second metal layer 320 is larger than a thickness of the first metal layer 310, and the thickness of the first metal layer 310 is equal to a thickness of the third metal layer 330. Note that in this disclosure, a thickness of a layer denotes, for example, a thickness of the said layer in the stacking direction S.

Furthermore, in this embodiment, the circuit board structure 10 is, for example, a final product whose manufacturing is substantially completed, but the disclosure is not limited thereto. In other embodiments, the circuit board structure may be a byproduct that is required to undergo one or more subsequent processes; in such embodiments, the manufacturing method of the circuit board structure according to the disclosure may not include the steps shown in FIGS. 7 to 17, and may merely include the steps shown in FIGS. 1 to 6.

Other embodiments are described below for illustrative purposes. It is to be noted that the following embodiments use the reference numerals and a part of the contents of the above embodiments, the same reference numerals are used to denote the same or similar elements, and the description of the same technical contents is omitted. For the description of the omitted part, reference may be made to the above embodiments, and details are not described in the following embodiments.

Figure 19:
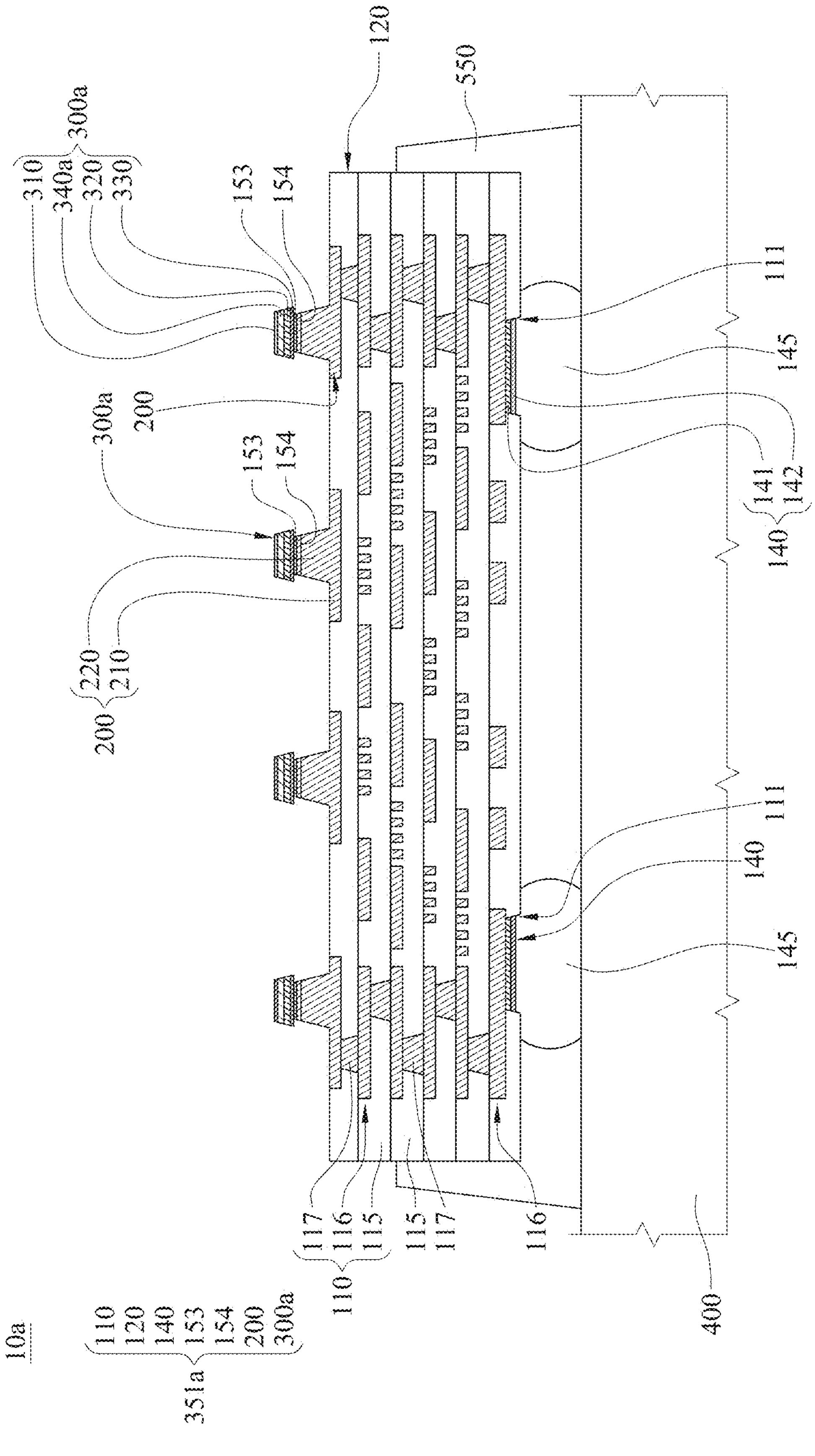
FIG. 19 is a cross-sectional view of a circuit board structure according to a second embodiment of the disclosure.

The disclosure is not limited by the structure of the surface treatment layer 300. For example, please refer to FIG. 19 that is a cross-sectional view of a circuit board structure 10*a* according to a second embodiment of the disclosure. The only difference between the circuit board structure 10*a* of this embodiment and the circuit board structure 10 of the first embodiment is the structure of a surface treatment layer 300*a* of a RDL substrate 351*a*. Thus, the structure of the surface treatment layer 300*a* will be described in detail hereinafter, and other repeated descriptions will be omitted. In this embodiment, the surface treatment layer 300*a* further includes a fourth metal layer 340*a*. The fourth metal layer 340*a* is disposed between the first metal layer 310 and the second metal layer 320. In addition, a material of the fourth metal layer 340*a* is different from the material of the first metal layer 310 and the material of the second metal layer 320. Further, the fourth metal layer 340*a* is made by, for example, palladium (Pd). A thickness of the fourth metal layer 340*a* is, for example, equal to the thickness of the second metal layer 320. Further, the thickness of the second metal layer 320 ranges, for example, from 0.05 μm to 10 μm, and the thickness of the fourth metal layer 340*a* ranges, for example, from 0.01 μm to 0.1 μm. Moreover, in other embodiments, the thickness of the second metal layer may be different from the thickness of the fourth metal layer.

Figure 20:
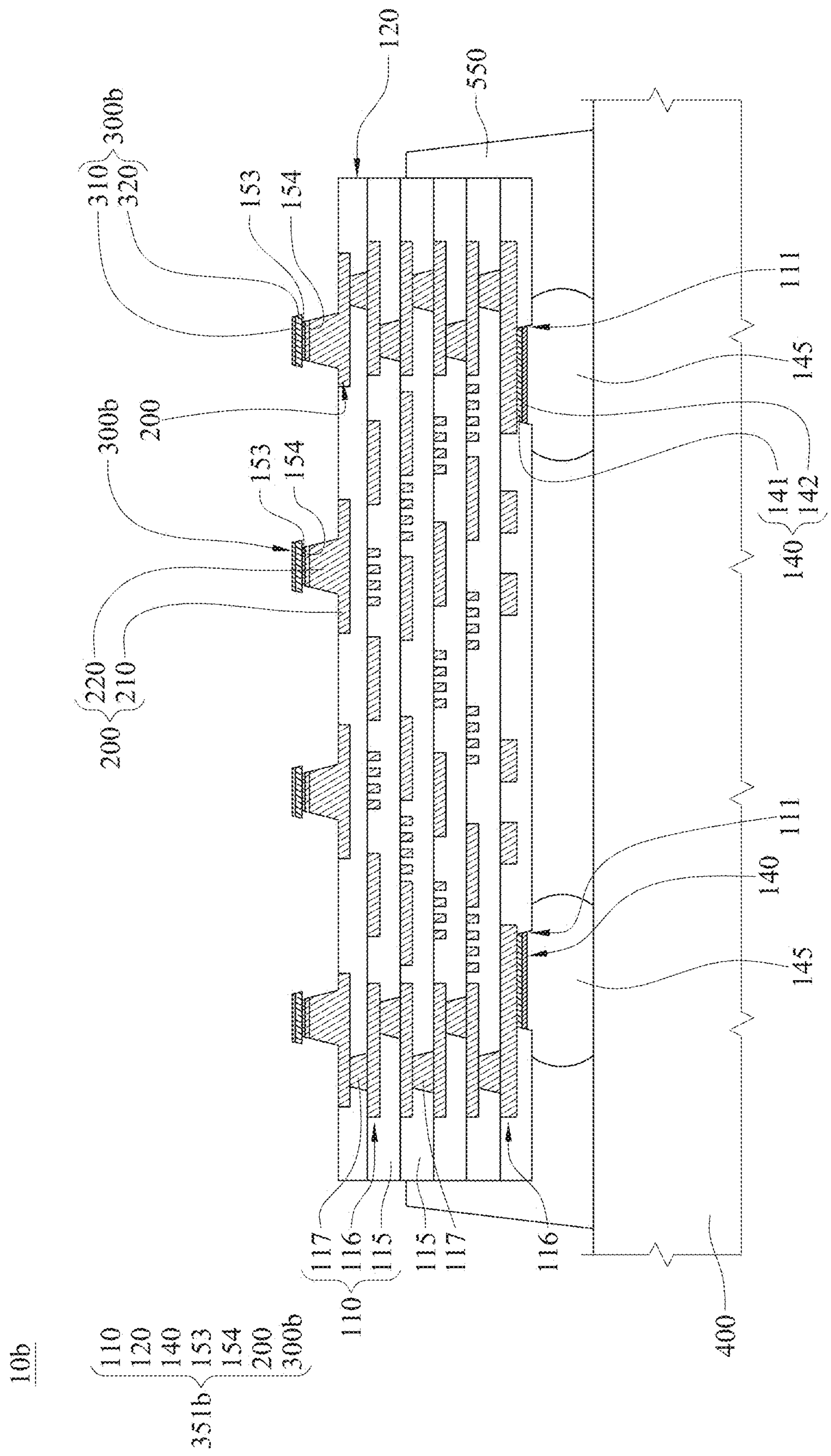
FIG. 20 is a cross-sectional view of a circuit board structure according to a third embodiment of the disclosure.

Alternatively, please refer to FIG. 20 that is a cross-sectional view of a circuit board structure 10*b* according to a third embodiment of the disclosure. The only difference between the circuit board structure 10*b* of this embodiment and the circuit board structure 10 of the first embodiment is the structure of a surface treatment layer 300*b* of a RDL substrate 351*b*. Thus, the structure of the surface treatment layer 300*b* will be described in detail hereinafter, and other repeated descriptions will be omitted. In this embodiment, the surface treatment layer 300*b* includes the first metal layer 310 and the second metal layer 320 without including the third metal layer 330 of the first embodiment.

Figure 21:
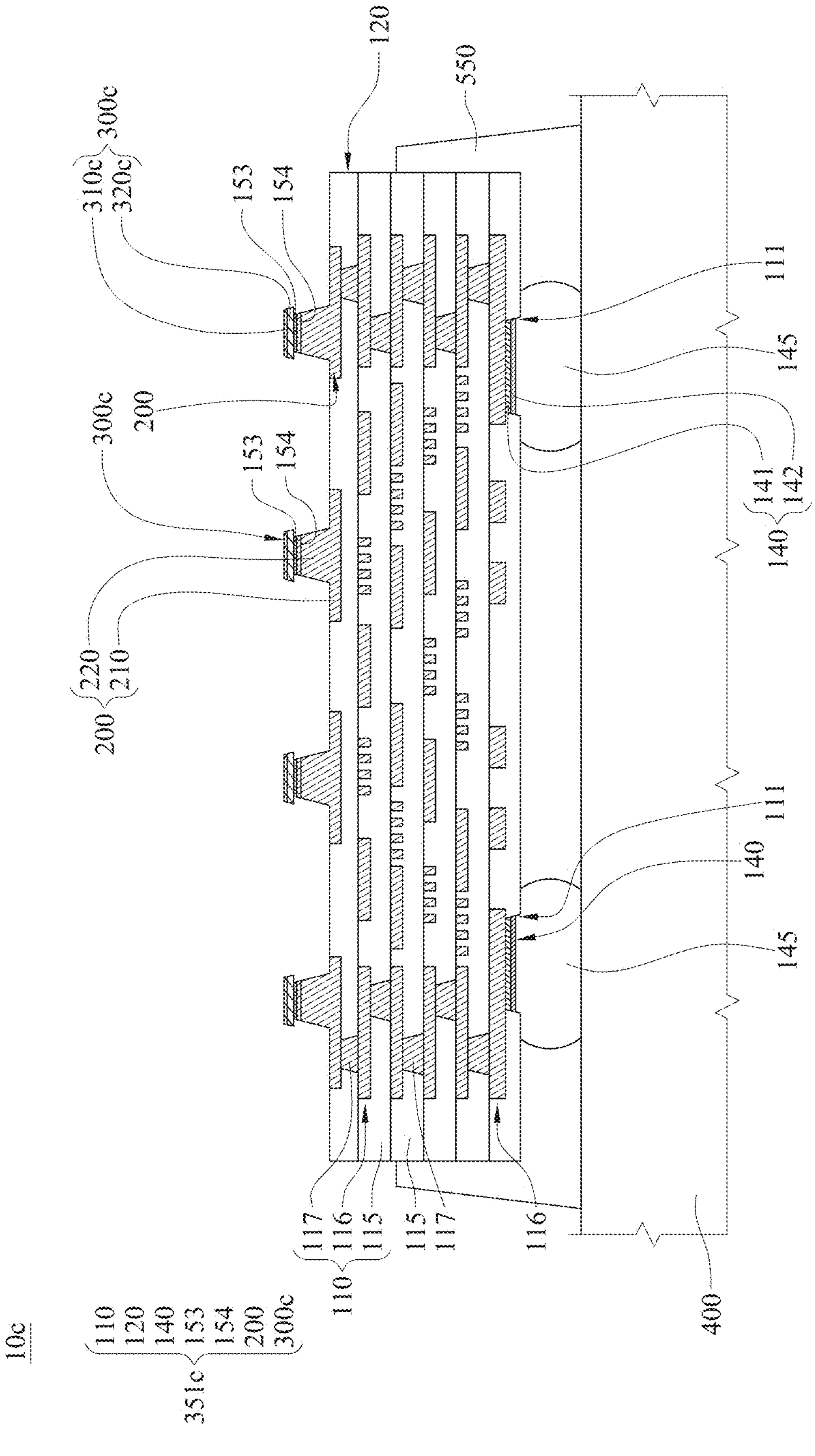
FIG. 21 is a cross-sectional view of a circuit board structure according to a fourth embodiment of the disclosure.

Alternatively, please refer to FIG. 21 that is a cross-sectional view of a circuit board structure 10*c* according to a fourth embodiment of the disclosure. The only difference between the circuit board structure 10*c* of this embodiment and the circuit board structure 10*b* of the third embodiment is a material of a surface treatment layer 300*c* of a RDL substrate 351*c*. Thus, the material of the surface treatment layer 300*c* will be described in detail hereinafter, and other repeated descriptions will be omitted. In this embodiment, a first metal layer 310*c* and a second metal layer 320*c* are made by identical or the same material, such as silver.

According to the circuit board structure and the manufacturing method thereof disclosed by above embodiments, before the formation of the pad, the surface treatment layer has been formed on the temporary substrate that is flat and has stable thermal expansion coefficient. In other words, before the formation of the pad, the surface treatment layer is previously formed on the temporary substrate without defects such as warpage. Thus, the thickness and the uniformity of the surface treatment layer are accurately controlled to allow the gap between the pads to be shortened, thereby increasing the density of the pads in the circuit board structure. Also, the flatness of the surface treatment layer is enhanced, and the roughness of the surface treatment layer is reduced.

In addition, the surface treatment layer is formed on the temporary substrate in the through hole. Thus, when the pad is formed on the surface treatment layer, the surface treatment layer and the pad are not overlapped with each other along the horizontal direction. That is, the surface treatment layer and the pad do not cover each other. With such configuration, the gas generated during the formation of the surface treatment layer will flow out of the through hole, and thus the cavity defect caused by the accumulation of the bubble is prevented, which further enhances the bonding force and reliability of the pad.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A circuit board structure, comprising:
a built-up structure;
at least one pad, disposed on the built-up structure; and
a surface treatment layer, disposed on the at least one pad; and
wherein, the surface treatment layer and the at least one pad are not overlapped with each other in a horizontal direction, and the horizontal direction is perpendicular to a stacking direction of the surface treatment layer and the at least one pad;
wherein the at least one pad comprises a buried part and a protruding part, the buried part is buried in the built-up structure, the protruding part protrudes from the buried part, and at least a part of the protruding part is located outside the built-up structure.

2. The circuit board structure according to claim 1, wherein the surface treatment layer comprises a first metal layer and a second metal layer, the second metal layer is disposed on the at least one pad, and the first metal layer is disposed on the second metal layer.

3. The circuit board structure according to claim 2, wherein a material of the first metal layer is different from a material of the second metal layer.

4. The circuit board structure according to claim 2, wherein a material of the first metal layer is identical to a material of the second metal layer.

5. The circuit board structure according to claim 2, wherein the surface treatment layer further comprises a third metal layer disposed between the second metal layer and the at least one pad.

6. The circuit board structure according to claim 5, wherein a material of the first metal layer is different from a material of the second metal layer, and the material of the first metal layer is identical to a material of the third metal layer.

7. The circuit board structure according to claim 5, wherein the surface treatment layer further comprises a fourth metal layer disposed between the first metal layer and the second metal layer.

8. The circuit board structure according to claim 7, wherein a material of the first metal layer is different from a material of the second metal layer, the material of the first metal layer is identical to a material of the third metal layer, and a material of the fourth metal layer is different from the material of the first metal layer and the material of the second metal layer.

9. The circuit board structure according to claim 1, wherein an outer surface of the buried part is flush with an outer surface of the built-up structure.

10. A manufacturing method of circuit board structure, comprising:
providing a temporary substrate;
forming a dielectric layer having at least one through hole on the temporary substrate;
forming a surface treatment layer on the temporary substrate in the at least one through hole;
forming at least one pad on the surface treatment layer;
forming a built-up structure on the dielectric layer;
assembling the built-up structure to a substrate;
removing the temporary substrate; and
removing the dielectric layer;

wherein the manufacturing method of circuit board structure further comprises:

forming a seed layer on the surface treatment layer after forming the surface treatment layer; and removing a part of the seed layer after removing the dielectric layer.

11. The manufacturing method of circuit board structure according to claim 10, wherein the temporary substrate comprises a base, a release layer and a seed layer, the release layer is disposed on the base, the seed layer is disposed on the release layer, the surface treatment layer is formed on the seed layer, and the base is a ceramic substrate, a glass substrate, a silicon substrate or a stainless substrate.

12. A manufacturing method of circuit board structure, comprising:

providing a temporary substrate;

forming a dielectric layer having at least one through hole on the temporary substrate;

forming a surface treatment layer on the temporary substrate in the at least one through hole; and forming at least one pad on the surface treatment layer;

wherein the manufacturing method of circuit board structure further comprises:

forming a seed layer on the surface treatment layer after forming the surface treatment layer; and removing a part of the seed layer after removing the dielectric layer.

* * * * *